(12) United States Patent
Yu et al.

(10) Patent No.: US 11,327,372 B2
(45) Date of Patent: May 10, 2022

(54) DISPLAY PANEL AND METHOD OF FABRICATING THE SAME

(71) Applicant: Au Optronics Corporation, Hsinchu (TW)

(72) Inventors: Chih-Yu Yu, Hsinchu (TW); Yi-Wei Tsai, Hsinchu (TW); Yung-Hsiang Lan, Hsinchu (TW); Yen-Huei Lai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 34 days.

(21) Appl. No.: 16/937,589

(22) Filed: Jul. 24, 2020

(65) Prior Publication Data

US 2021/0026182 A1     Jan. 28, 2021

Related U.S. Application Data

(60) Provisional application No. 62/878,857, filed on Jul. 26, 2019.

(30) Foreign Application Priority Data

Mar. 24, 2020  (TW) .................................. 109109750

(51) Int. Cl.
  *G02F 1/13*        (2006.01)
  *G02F 1/1362*      (2006.01)
  (Continued)

(52) U.S. Cl.
  CPC ...... *G02F 1/13452* (2013.01); *G02F 1/13458* (2013.01); *H05K 3/0052* (2013.01); *H05K 2203/162* (2013.01)

(58) Field of Classification Search
  CPC ........ G02F 1/13; G02F 1/1303; G02F 1/1309; G02F 1/1362; G02F 1/13452; G02F 1/13458; G09G 3/00; G09G 3/006; G09G 3/3611; H01L 21/00; H01L 21/66; H01L 21/70; H01L 23/58; H01L 23/66
  (Continued)

(56) References Cited

U.S. PATENT DOCUMENTS 3,863,261  A  *  1/1975  Klein ........................ B41J 2/415
                                                          347/124
6,310,667  B1 * 10/2001  Nakayoshi ........ G02F 1/136204
                                                          349/42
(Continued)

FOREIGN PATENT DOCUMENTS

| CN | 102789076 | 11/2012 |
|---|---|---|
| CN | 109192117 | 1/2019 |
| CN | 208722547 | 4/2019 |

*Primary Examiner* — Xiaoliang Chen
(74) *Attorney, Agent, or Firm* — JCIPRNET (57) ABSTRACT

A display panel including a substrate, a plurality of bonding pads, and a plurality of conductive traces is provided. The substrate has a substrate edge, a display region, and a peripheral region disposed between the substrate edge and the display region. The plurality of bonding pads are arranged in the peripheral region of the substrate. The plurality of conductive traces are electrically connected to the bonding pads. The conductive traces extend between the bonding pads and the substrate edge and have a plurality of breaks. A method of fabricating the display panel is also provided.

8 Claims, 8 Drawing Sheets

(51) Int. Cl.
*G09G 3/00* (2006.01)
*G09G 3/06* (2006.01)
*H01L 21/00* (2006.01)
*H01L 21/66* (2006.01)
*H01L 21/70* (2006.01)
*H01L 23/58* (2006.01)
*H01L 23/66* (2006.01)
*G02F 1/1345* (2006.01)
*H05K 3/00* (2006.01)

(58) Field of Classification Search
USPC ............ 361/749; 257/48, 59; 349/33, 42, 43
See application file for complete search history.

(56) References Cited

U.S. PATENT DOCUMENTS

| | | | | |
|---|---|---|---|---|
| 9,502,393 | B2* | 11/2016 | Shin | G02F 1/1309 |
| 10,707,289 | B2* | 7/2020 | Li | H01L 51/0097 |
| 2007/0093107 | A1* | 4/2007 | Motohashi | H05K 1/117 |
| | | | | 439/188 |
| 2008/0277660 | A1* | 11/2008 | Tsurume | H01L 21/6835 |
| | | | | 257/48 |
| 2011/0084589 | A1* | 4/2011 | Torma | H01K 3/08 |
| | | | | 313/269 |
| 2011/0127536 | A1* | 6/2011 | Yoshida | H01L 33/0041 |
| | | | | 257/59 |
| 2012/0162165 | A1 | 6/2012 | Lee et al. | |
| 2013/0299850 | A1* | 11/2013 | Yoshida | H01L 33/0041 |
| | | | | 257/79 |
| 2014/0132873 | A1* | 5/2014 | Ogasawara | G02F 1/13452 |
| | | | | 349/43 |
| 2014/0146491 | A1* | 5/2014 | Chan | H05K 1/189 |
| | | | | 361/749 |
| 2014/0184966 | A1* | 7/2014 | Ogasawara | G02F 1/1309 |
| | | | | 349/33 |
| 2016/0205781 | A1* | 7/2016 | Chan | G02F 1/13452 |
| | | | | 361/749 |
| 2017/0215288 | A1* | 7/2017 | Shi | H01L 27/3276 |
| 2017/0219856 | A1* | 8/2017 | Fu | G09G 3/006 |
| 2020/0168515 | A1 | 5/2020 | Li | |
| 2021/0328202 | A1* | 10/2021 | Ou | H01L 51/5253 |

* cited by examiner

DISPLAY PANEL AND METHOD OF FABRICATING THE SAME

CROSS-REFERENCE TO RELATED APPLICATION

This application claims the priority benefits of U.S. provisional application Ser. No. 62/878,857, filed on Jul. 26, 2019, and Taiwan application serial no. 109109750, filed on Mar. 24, 2020. The entirety of each of the above-mentioned patent applications is hereby incorporated by reference herein and made a part of this specification.

BACKGROUND

Technical Field

The disclosure relates to an electronic device and a method of fabricating the same, and in particular, to a display panel and a method of fabricating the same.

Description of Related Art

Generally, a display panel is composed of a thin film transistor array substrate and a display medium layer disposed thereon. Particularly, the thin film transistor array substrate may be further divided into an active region and a peripheral circuit region. A pixel array is disposed in the active region, and elements such as a plurality of conductive traces (or leads), a plurality of bonding pads, and a testing transistor, etc. are disposed in the peripheral circuit region. Generally, after a display panel is fabricated, a series of detection procedures are performed to determine whether display quality of the display panel meets the standard.

Generally, after the detection procedures are performed, the display panel needs to be cut to remove a testing pad used for an electrical test. A manner of configuring the conductive traces (for example, a width of the trace and a pitch between the traces) in the peripheral circuit region varies owing to different product designs (for example, pixel resolution). Therefore, during cutting, cutting parameters (such as a laser power or a depth of depression of a cutter wheel) usually need to be adjusted for display panels of different product specifications, so as to ensure that the cutting of the substrate causes no damage to the display panel. However, as resolution of display panels continuously increases, the pitch between the conductive traces for testing continuously decreases. As such, an electrical short circuit to the conductive traces of the display panel is generated in the cutting direction after the testing pads are removed.

SUMMARY

The disclosure provides a display panel exhibiting a good production yield.

The disclosure provides a method of fabricating a display panel, which exhibits a good cutting yield.

A display panel of the disclosure includes a substrate, a plurality of bonding pads, and a plurality of conductive traces. The substrate includes a substrate edge, a display region, and a peripheral region disposed between the substrate edge and the display region. The plurality of bonding pads are arranged in the peripheral region of the substrate. The plurality of conductive traces are electrically connected to the bonding pads. The plurality of conductive traces extend between the bonding pads and the substrate edge and have a plurality of breaks.

A method of fabricating a display panel of the disclosure includes the following steps. A breaking step for a plurality of conductive traces is performed, so that a plurality of bonding pads and a plurality of testing pads of the display panel are electrically separated. A cutting step for a substrate of the display panel is performed along a cutting line, and a flexible printed circuit board is electrically bonded to the bonding pads of the display panel. The bonding pads and the testing pads are disposed in a peripheral region of the display panel on at least one side of the substrate, and the conductive traces of the display panel are electrically connected between the bonding pads and the testing pads. After the breaking step is completed, each of the conductive traces has a plurality of breaks. In the cutting step for the substrate, the cutting line is located between the breaks of the conductive traces and the testing pads.

Based on the above, in the method of fabricating the display panel according to an embodiment of the disclosure, in the uncut display panel, the plurality of breaks are provided on the plurality of conductive traces connected between the plurality of bonding pads and the plurality of testing pads. In the cutting step for the substrate, the display panel is cut along the cutting line between the testing pads and the bonding pads to remove thee testing pads. The breaks of the conductive traces are disposed between the bonding pads and the cutting line, so that an electrical short circuit of the conductive traces may be avoided during the cutting, and a cutting yield of the display panel is thereby improved. Therefore, in the display panel according to an embodiment of the disclosure, each of the plurality of conductive traces extending between the cut substrate edge and the plurality of bonding pads has the breaks.

DESCRIPTION OF THE EMBODIMENTS

As used herein, "about", "approximately", "essentially" or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±15%, ±10%, ±5% of the stated value. Further, as used herein, "about", "approximately", "essentially" or "substantially" may depend on measurement properties, cutting properties, or other properties to select a more acceptable range of deviations or standard deviations without one standard deviation for all properties.

In the accompanying drawings, the thicknesses of layers, films, panels, regions, and the like are enlarged for clarity. It should be understood that when a component such as a layer, film, region or substrate is referred to as being "on" or "connected to" another component, it may be directly on or connected to the another component, or intervening components may also be present. In contrast, when a component is referred to as being "directly on" or "directly connected to" another component, there are no intervening components present. As used herein, "connection" may refer to a physical and/or electrical connection. Furthermore, "electrical connection" may mean that there are other elements between two elements.

In addition, spatially relative terms such as "below", "bottom", "on" or "top" are used in this specification to describe a relationship between one element and another element, as shown in the figures. It should be understood that such spatially relative terms are intended to encompass different orientations of the device in addition to the orientation depicted in the figures. For example, if the device in the figures is turned over, an element described as being "below" relative to another element will then be "above" relative to the other element. Therefore, the exemplary term "below" encompasses both the below and above orientations depending on the spatial orientation of the device. Similarly, if the device in the figures is turned over, an element described as being "below" or "lower" relative to another element will then be "above" or "upper" relative to the other element. Therefore, the exemplary term "above" or "below" encompasses both the above and below orientations.

Exemplary embodiments of the disclosure are described in detail, and examples of the exemplary embodiments are shown in the accompanying drawings. Whenever possible, the same element symbols are used in the drawings and descriptions to indicate the same or similar parts.

Figure 1:
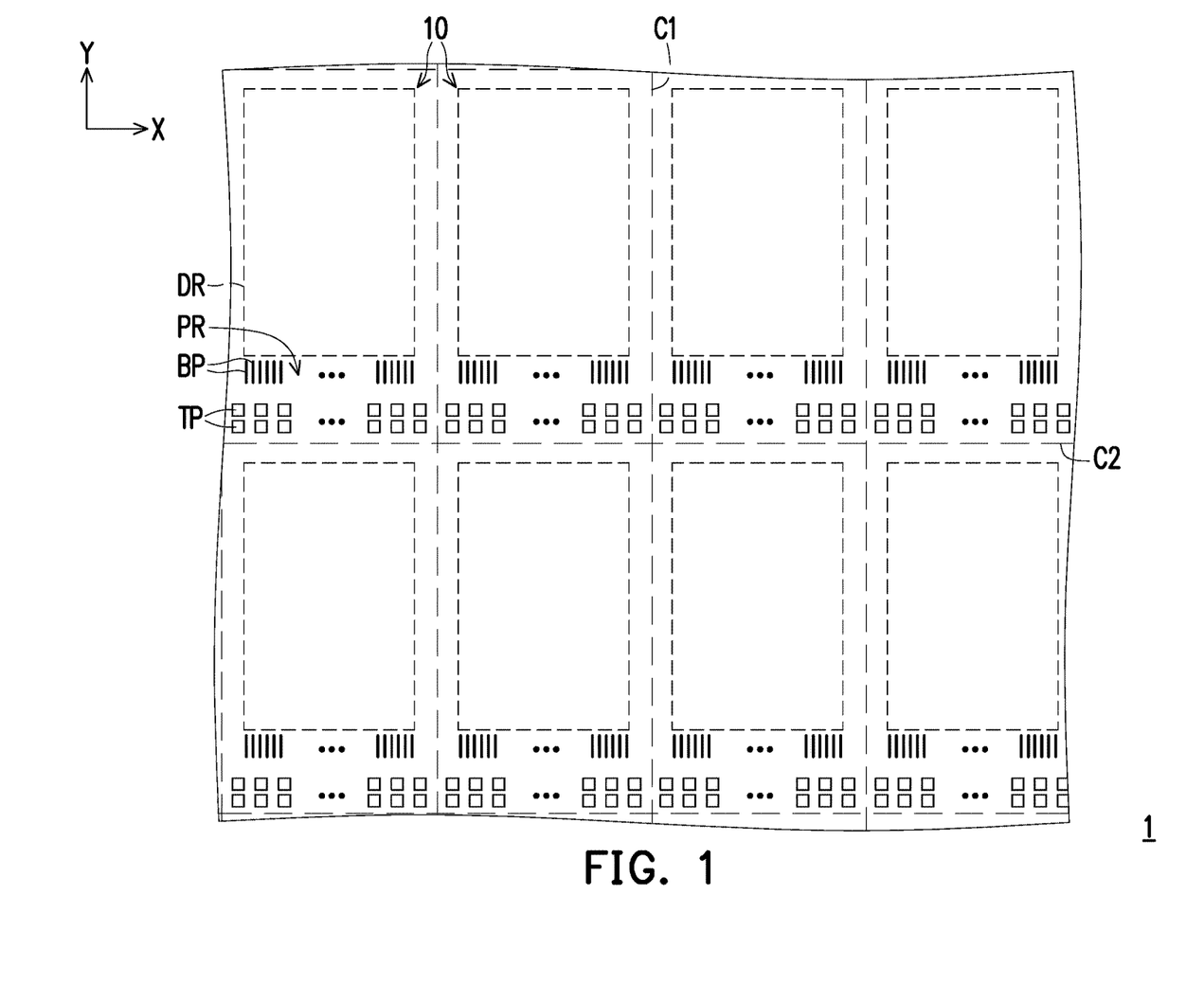
FIG. 1 is a schematic top view of a motherboard of a display panel according to an embodiment of the disclosure.
Figure 2A:
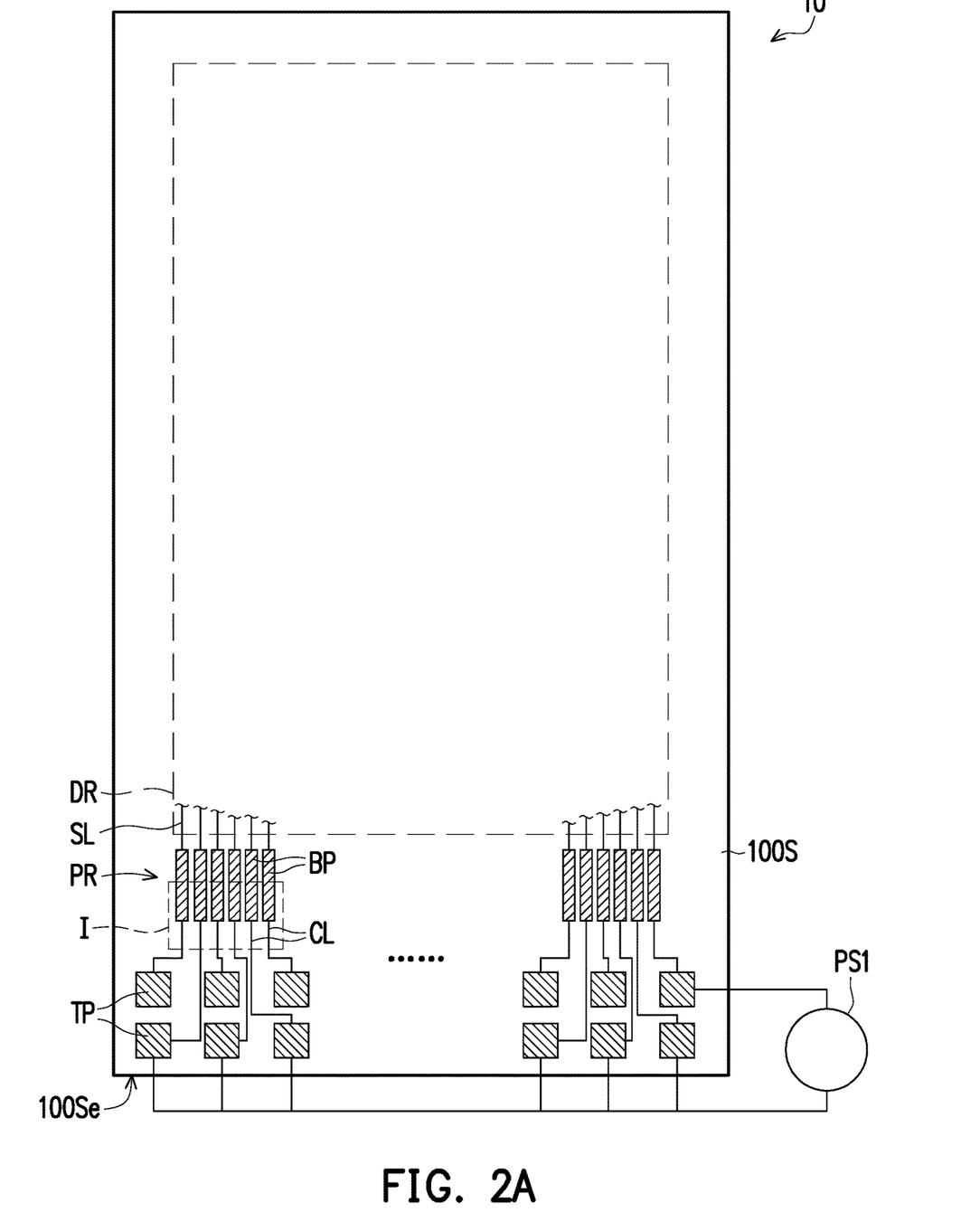
FIG. 2A to FIG. 2D are schematic top views of a process of fabricating the display panel according to an embodiment of the disclosure.
Figure 2B:
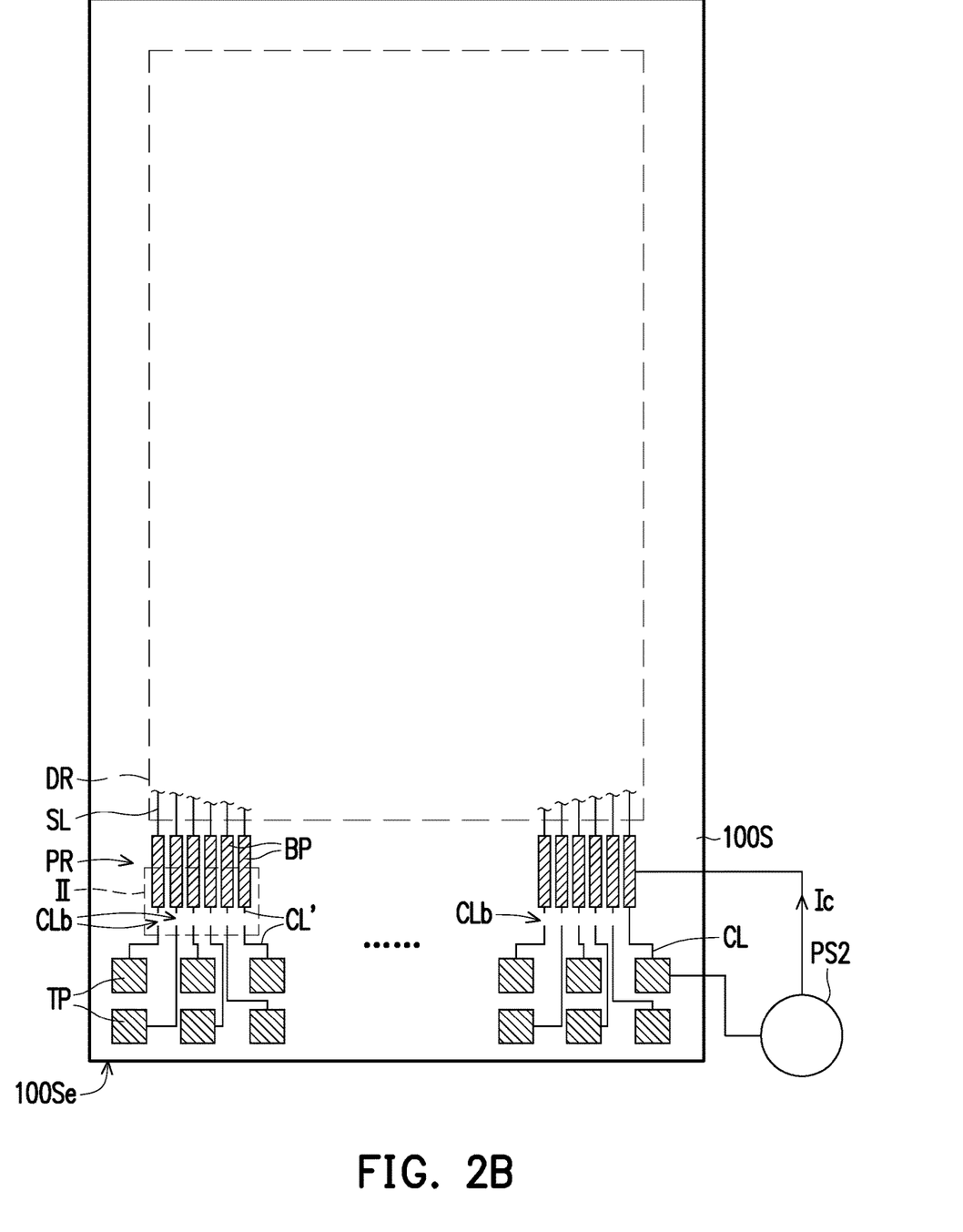
Figure 2C:
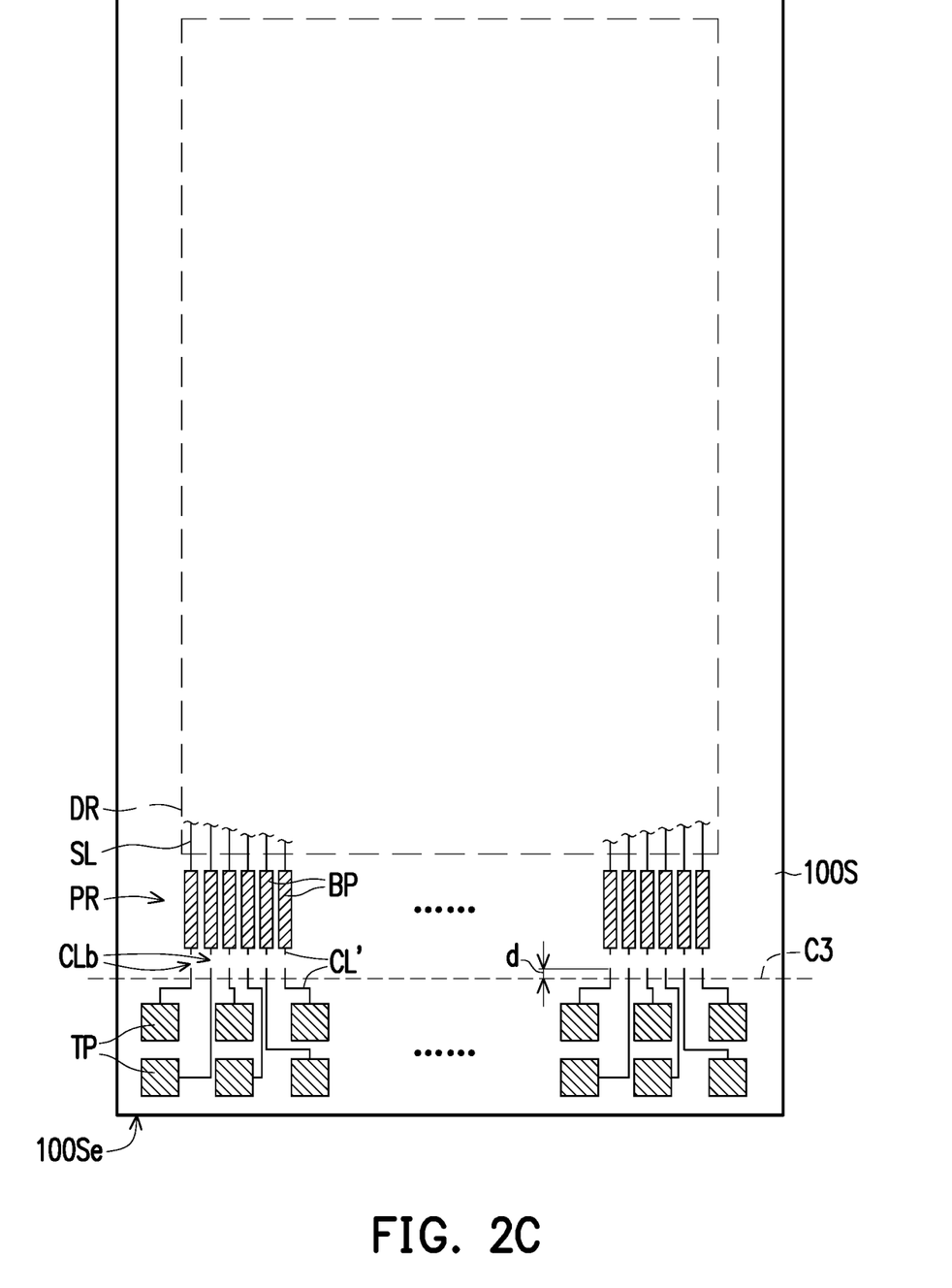

FIG. 1 is a schematic top view of a motherboard of a display panel according to an embodiment of the disclosure. FIG. 2A to FIG. 2D are schematic top views of a process of fabricating the display panel according to an embodiment of the disclosure. FIG. 3A and FIG. 3B are schematic enlarged views of partial regions of the display panel in FIG. 2A and FIG. 2B, respectively. In particular, FIG. 3A corresponds to a partial region I in FIG. 2A, and FIG. 3B corresponds to a partial region II in FIG. 2B. For clarity, FIG. 1 omits illustration of a conductive trace CL and a signal line SL in FIG. 2A.

Figure 2D:
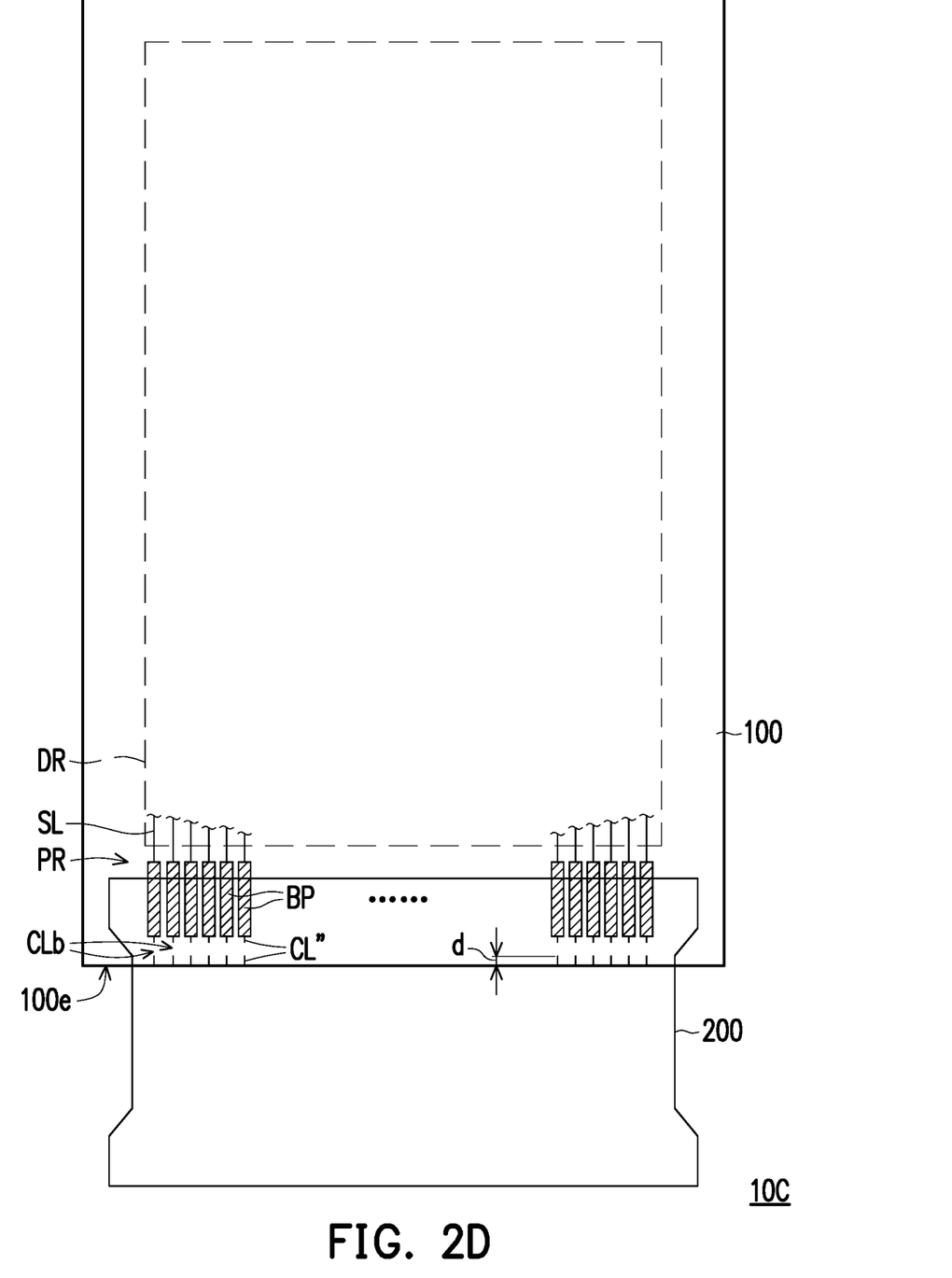
Figure 3A:
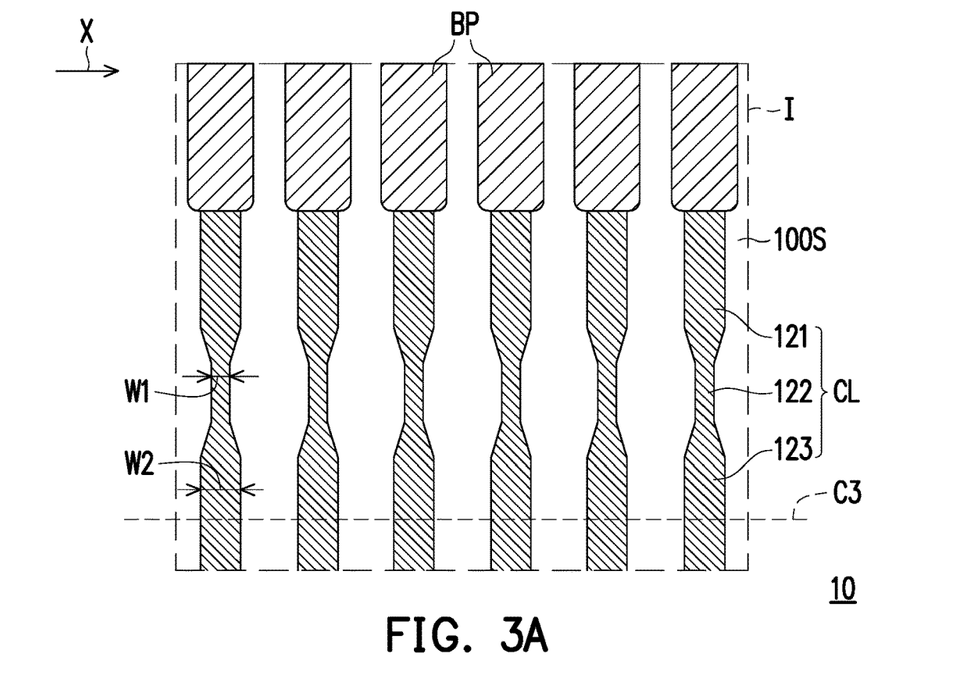
FIG. 3A and FIG. 3B are schematic enlarged views of partial regions of the display panel in FIG. 2A and FIG. 2B, respectively.
Figure 3B:
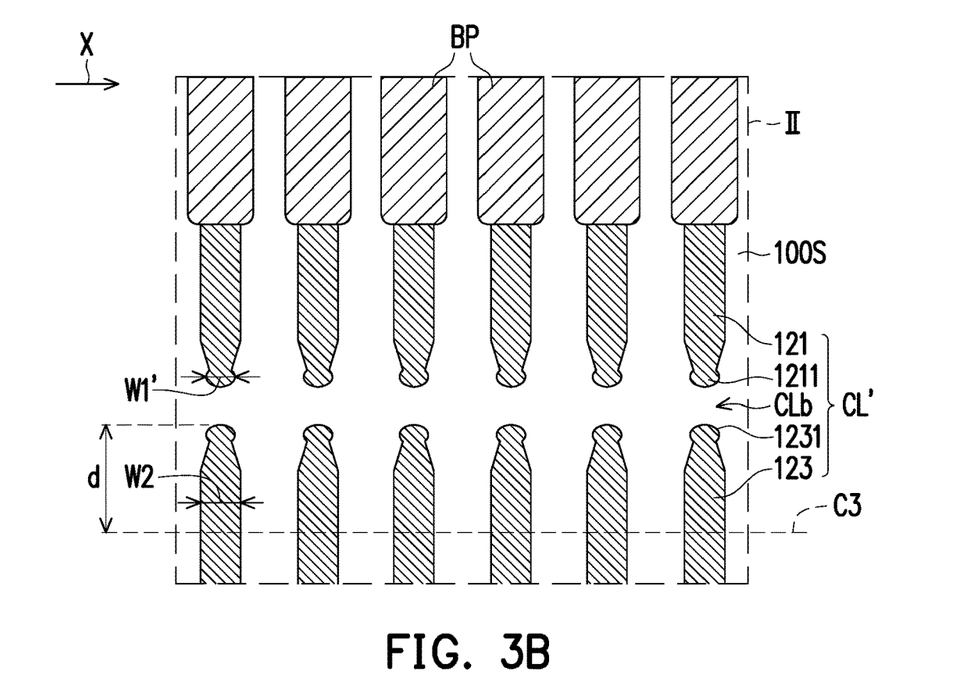

Referring to FIG. 2D, in the present embodiment, a display panel 10C includes a substrate 100, a plurality of bonding pads BP, and a plurality of conductive traces CL". The substrate 100 has a substrate edge 100e, a display region DR, and a peripheral region PR disposed between the substrate edge 100e and the display region DR. The plurality of bonding pads BP are arranged in the peripheral region PR of the substrate 100 in a direction. In the present embodiment, the direction may be a direction in which the substrate edge 100e extends, but the disclosure is not limited thereto. The plurality of conductive traces CL" are electrically connected to the plurality of bonding pads BP, respectively. More specifically, the conductive traces CL" located in the peripheral region PR extend between the substrate edge 100e and the bonding pads BP. It is worth noting that the conductive traces CL" have a plurality of breaks CLb. The breaks CLb are located between the substrate edge 100e and the plurality of bonding pads BP. Through the above configuration of the breaks CLb, an electrical short circuit of the conductive traces CL" may be avoided during cutting, and a cutting yield of the display panel 10C is thereby improved.

Further, the display panel 10C may further include a counter substrate (not shown) and a display medium layer (not shown) disposed between the substrate 100 and the counter substrate. In the present embodiment, the display medium layer includes a plurality of liquid crystal molecules, for example. In other words, the display panel 10C in the present embodiment may be a liquid crystal display panel, but the disclosure is not limited thereto. According to other embodiments, the display medium layer may further include a plurality of light emitting structures. In other words, the display panel may also be an organic light emitting diode (OLED) panel, a micro light emitting diode (micro-LED) panel, or a mini light emitting diode (mini-LED) panel. In the present embodiment, the substrate 100 and the counter substrate of the display panel 10C are, for example, flexible substrates, but the disclosure is not limited thereto.

It should be understood that, in the present embodiment, a flexible printed circuit board (FPCB) 200 may be further provided on one side of the substrate edge 100e of the substrate 100. The FPCB 200 is electrically bonded to the bonding pads BP. In the present embodiment, the FPCB 200 is, for example, a transmission circuit board using a chip on film (COF) package. In other words, the FPCB 200 may be a package structure having a driver chip and a transmission line, but the disclosure is not limited thereto. In other embodiments, the FPCB 200 may also be a transmission circuit board formed by using a tape automated bonding (TAB) technology. In another embodiment, the FPCB 200 may not have a driver chip.

In addition, the display panel 10C further includes a plurality of signal lines SL. The signal lines SL are disposed in the display region DR and extend to the peripheral region PR to be electrically connected to the plurality of bonding pads BP. For example, a plurality of pixel structures (not shown) may be provided in the display region DR of the display panel 10C. The pixel structures are electrically connected to the signal lines SL, respectively. In other words, a drive signal sent by the FPCB 200 may be transmitted to the pixel structure in the display region DR through transmission by the bonding pad BP and the signal line SL, to display an image. A process of fabricating the display panel 10C is exemplarily described below.

Referring to FIG. 1 and FIG. 2A to FIG. 2D, a method of fabricating the display panel 10C includes: cutting a motherboard 1 to obtain a plurality of display panels 10. In the present embodiment, the motherboard 1 has a plurality of display panels 10 arranged in an array. In other words, the display panels 10 are arranged in a plurality of columns and a plurality of rows in a direction X and a direction Y, respectively, but the disclosure is not limited thereto. In other embodiments, in order to optimize utilization of the motherboard, the display panels may also have different sizes, and are not disposed on the motherboard in an array. For example, in the present embodiment, the motherboard 1 is cut along a plurality of cutting lines C1 and a plurality of cutting lines C2 through mechanical cutting (for example, fixed knife cutting, rotary cutter wheel cutting, or fixed knife die cutting, etc.). A direction in which the cutting line C1 extends intersects with a direction in which the cutting line C2 extends, but the disclosure is not limited thereto. In other embodiments, the motherboard 1 may also be cut through non-mechanical cutting (for example, laser cutting).

The display panel 10 obtained by cutting the motherboard 1 has a plurality of testing pads TP. The testing pads TP are disposed on at least one side of a substrate 100S of the display panel 10. In the present embodiment, the substrate 100S of the display panel 10 has a side edge 100Se corresponding to the cutting line C2. The testing pads TP are located between the side edge 100Se of the substrate 100S and the plurality of bonding pads BP, but the disclosure is not limited thereto. Referring to FIG. 2A and FIG. 3A, the method of fabricating the display panel 10C further includes: forming a plurality of conductive traces CL between the plurality of bonding pads BP and the plurality of testing pads TP. The conductive trace CL is electrically connected between one corresponding bonding pad BP and one corresponding testing pad TP. However, the disclosure is not limited thereto. According to other embodiments, the conductive trace may also be electrically connected between a plurality of corresponding bonding pads BP and one corresponding testing pad TP.

Further, the conductive trace CL has an extension section 121, a connection portion 122, and an extension section 123. The connection portion 122 is electrically connected between the extension section 121 and the extension section 123. For example, in the present embodiment, the connection portion 122 of the conductive trace CL has a width W1 in the direction X, and the extension section 123 (or the extension section 121) of the conductive trace CL has a width W2 in the direction X. The width W1 is less than the width W2, but the disclosure is not limited thereto. In an exemplary embodiment, a ratio of the width W1 of the connection portion 122 of the conductive trace CL to the width W2 of the extension portion 123 is less than 0.5. It should be noted that, in the present embodiment, the widths of the extension section 121 and the extension section 123 of the conductive trace CL in the direction X may be selectively the same, but the disclosure is not limited thereto. In other embodiments, the widths of the two extension sections of the conductive trace in the direction X may also be different, and both are greater than the width W1 of the connection portion 122.

Still referring to FIG. 2A, after the cutting step for the motherboard 1 is completed, a detection step for the display panel 10 is performed. For example, the detection step for the display panel 10 includes abutting a plurality of probe pins of a testing machine to the plurality of testing pads TP of the display panel 10 and applying at least one voltage signal between the testing pads TP for electrical testing and/or reliability testing. In the present embodiment, the at least one voltage signal may be a DC voltage signal provided by a power supply PS1 of the testing machine, but the disclosure is not limited thereto. It should be noted that the electrical connection between the power supply PS1 and the plurality of testing pads TP in FIG. 2A is merely for illustration, and the disclosure is not limited to the disclosure in the drawings.

After the detection step for the display panel 10 is completed, as shown in FIG. 2B and FIG. 3B, a breaking step for the plurality of conductive traces CL is performed to electrically separate the bonding pads BP and the testing pads TP. It is worth noting that after the breaking step for the conductive trace CL is completed, a conductive trace CL' having a break CLb is formed. For example, the breaking step for the conductive trace CL may be performed by the above testing machine. The difference therebetween is that two ends (for example, a high-potential end and a low-potential end) of a power supply PS2 (or the power supply PS1) of the testing machine are electrically connected to the bonding pad BP and the testing pad TP, respectively. Since the width W2 of the connection portion 122 of the conductive trace CL is less than the width W1 of the extension portion 123 (or the width of the extension portion 121), a resistivity of the connection portion 122 is greater than a resistivity of the extension portion 123 (or a resistivity of the extension portion 121). Therefore, when the power source PS2 is enabled to apply a current Ic is applied between the bonding pad BP and the testing pad TP, the current Ic flowing through the conductive trace CL generates a relatively large amount of heat energy when passing through the connection portion 122. As a result, a temperature of the connection portion 122 increases and exceeds a melting point thereof. In this case, the connection portion 122 of the conductive trace CL is broken and forms a break CLb. For example, a ratio of a current Ic value used for the breaking step to a current used for detection may be between 1 and 5, but the disclosure is not limited thereto.

It is worth noting that the conductive trace CL' formed after the conductive trace CL is broken further has an end portion 1211 and an end portion 1231 that define the break CLb. The end portion 1211 and the end portion 1231 are connected to the extension section 121 and the extension section 123, respectively. In the present embodiment, the end portion 1211 of the conductive trace CL' has a width W1' in the direction X. The width W1' of the end portion 1211 (or a width of the end portion 1231 in the direction X) is less than the width W2 of the extension section 123 in the direction X (or the width of the extension section 121 in the direction X).

Referring to FIG. 2C and FIG. 3B, after the breaking step for the conductive trace CL is completed, a cutting step for the substrate 100S is performed along a cutting line C3 to obtain a display panel 10C. It is worth noting that the cutting line C3 is located between the plurality of breaks CLb of the plurality of conductive traces CL' and the plurality of testing pads TP, or the plurality of connection portions 122 of the plurality of conductive traces CL are located between the cutting line C3 and the plurality of bonding pads BP (shown in FIG. 3A). For example, there is a shortest distance d between the plurality of breaks CLb of the plurality of conductive traces CL' and the cutting line C3. The shortest distance d may be greater than or equal to 50 microns, but the disclosure is not limited thereto. In other words, the cutting line C3 may be disposed in a region between the testing pad TP and a position at least 50 microns away from the break CLb. Accordingly, an adjustment margin of the cutting process of the substrate 100S may be increased. From another point of view, the breaks CLb of the conductive trace CL' are disposed between the bonding pad BP and the testing pad TP, so that an electrical short circuit of the conductive trace CL' may be avoided during the cutting, and a cutting yield of the display panel is thereby improved.

Referring to FIG. 2D, the cut conductive trace CL" extends between the substrate edge 100e of the substrate 100 and the bonding pad BP, and has a break CLb. It is worth noting that, due to the configuration relationship of the cutting line C3 (shown in FIG. 2C), a shortest distance d between the substrate edge 100e of the cut substrate 100 and the plurality of breaks CLb may be greater than or equal to 50 microns, but the disclosure is not limited thereto. Further, after the cutting step for the substrate 100S is completed, the FPCB 200 may be electrically bonded to the plurality of bonding pads BP. For example, the FPCB 200 may have a plurality of pins, and the FPCB 200 is electrically connected to a plurality of signal lines SL on the substrate 100 through thermocompression bonding of the pins and the plurality of bonding pads BP.

Some other embodiments are listed below to describe the disclosure in detail. The same components are marked with the same symbols, and the descriptions of the same technical contents are omitted. For the omitted parts, refer to the foregoing embodiments, and the descriptions thereof are omitted herein.

Figure 4:
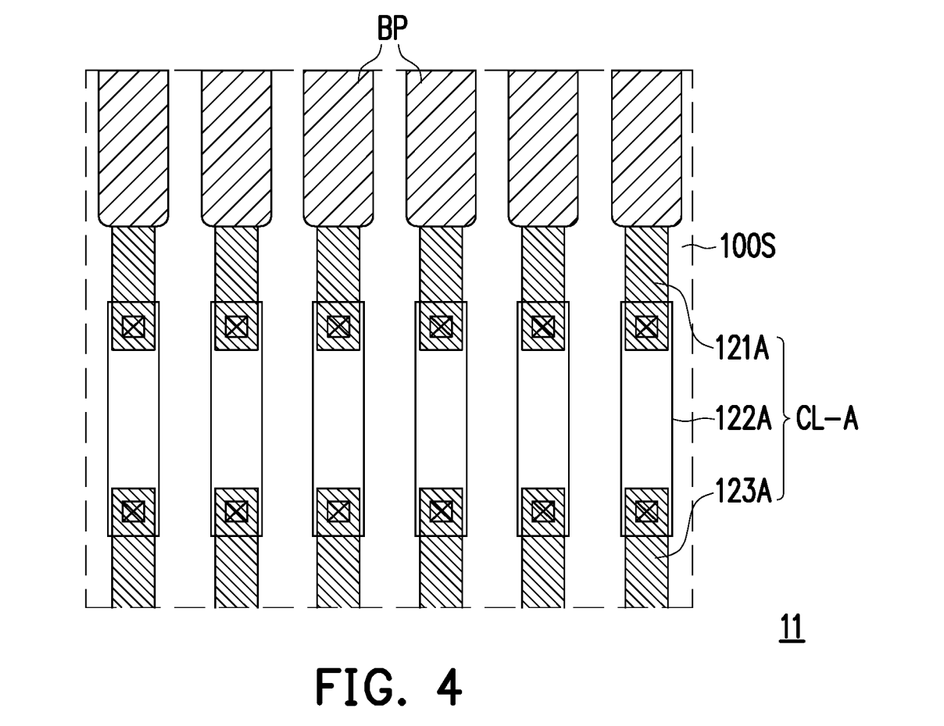
FIG. 4 is a schematic top view of a partial region of a display panel according to another embodiment of the disclosure.
Figure 5:
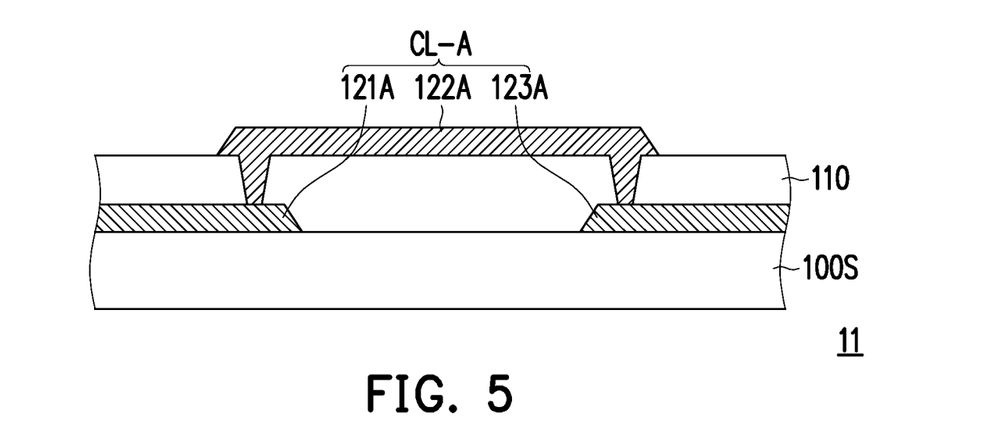
FIG. 5 is a schematic cross-sectional view of the display panel in FIG. 4.

FIG. 4 is a schematic top view of a partial region of a display panel according to another embodiment of the disclosure. FIG. 5 is a schematic cross-sectional view of the display panel in FIG. 4. It should be particularly noted that, for clarity, FIG. 4 omits illustration of an insulation layer 110 in FIG. 5. Referring to FIG. 4 and FIG. 5, a main difference between the display panel 11 in the present embodiment and the display panel 10 in FIG. 3A lies in different compositions of conductive traces. Specifically, a conductive trace CL-A of the display panel 11 has an extension section 121A and an extension section 123A structurally separated from each other and a connection portion 122A electrically connected between the extension section 121A and the extension section 123A. In the present embodiment, a step of forming a plurality of conductive traces CL-A may selectively include forming an insulation layer 110 between the extension section and the connection portion 122A. In other words, the connection portion 122A and the extension section of the conductive trace CL-A may belong to different film layers.

For example, in the present embodiment, the insulation layer 110 covers the extension section 121A and the extension section 123A of the conductive trace CL-A. The connection portion 122A of the conductive trace CL-A is disposed on the insulation layer 110, and two ends of the connection portion 122A penetrate through the insulation layer 110 to be electrically connected to the extension section 121A and the extension section 123A, respectively. However, the disclosure is not limited thereto. In other embodiments not shown, the connection portion of the conductive trace may also be disposed between the insulation layer 110 and the substrate 100S, and the two extension sections each penetrate through the insulation layer 110 to be electrically connected to the connection portion.

It is worth mentioning that, in the present embodiment, resistivities of the two extension sections of the conductive trace CL-A may be smaller than a resistivity of the connection portion 122A. Therefore, in the breaking step for the conductive trace CL-A, a current flowing through the conductive trace CL-A generates a relatively large amount of heat energy when passing through the connection portion 122A. As a result, a temperature of the connection portion 122A increases and exceeds a melting point thereof. In this case, the connection portion 122A of the conductive trace CL-A is broken and forms a break (not shown). Through the disposed break, an electrical short circuit of the conductive traces CL-A may be avoided during a subsequent cutting process, and a cutting yield of the display panel 11 is thereby improved.

Figure 6:
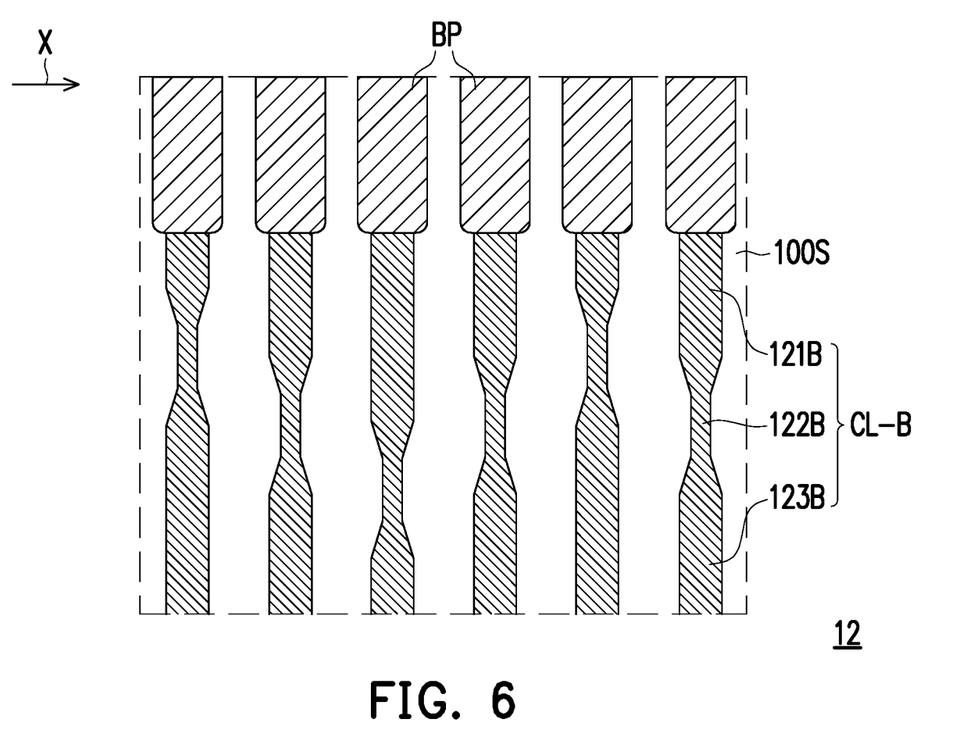
FIG. 6 is a schematic top view of a partial region of a display panel according to still another embodiment of the disclosure.

FIG. 6 is a schematic top view of a partial region of a display panel according to still another embodiment of the disclosure. Referring to FIG. 6, a difference between a display panel 12 in the present embodiment and the display panel 10 in FIG. 3A lies in different configurations of connection portions of conductive traces. Specifically, a plurality of connection portions 122B of a plurality of conductive traces CL-B of the display panel 12 are staggered from each other in a direction (for example, a direction X) in which the bonding pads BP are arranged. In other words, a connection portion 122B of any of the plurality of conductive traces CL-B may overlap an extension section 121B or an extension section 123B of an adjacent conductive trace CL-B in the direction X.

It should be understood that a plurality of breaks formed by the conductive traces CL-B after a breaking step are also staggered from each other in the direction X (not shown). It is worth mentioning that, through the staggering relationship of the plurality of connection portions 122B of the plurality of conductive traces CL-B, heat energy generated when a current passes through the connection portions 122B may be dispersed, and that independent electrical properties of the bonding pads BP are ensured after a cutting step for the substrate 100S is completed.

In view of the foregoing, in the method of fabricating the display panel according to an embodiment of the disclosure, in the uncut display panel, the plurality of breaks are provided on the plurality of conductive traces connected between the plurality of bonding pads and the plurality of testing pads. In the cutting step for the substrate, the display panel is cut along the cutting line between the testing pads and the bonding pads to remove these testing pads. The breaks of the conductive traces are disposed between the bonding pads and the cutting line, so that an electrical short circuit of the conductive traces may be avoided during the cutting, a cutting yield of the display panel is thereby improved. Therefore, in the display panel according to an embodiment of the disclosure, each of the plurality of conductive traces extending between the cut substrate edge and the plurality of bonding pads has the breaks.

What is claimed is:

1. A display panel, comprising:
a substrate comprising a substrate edge, a display region, and a peripheral region disposed between the substrate edge and the display region;
a plurality of bonding pads arranged in the peripheral region of the substrate; and
a plurality of conductive traces electrically connected to the bonding pads, the conductive traces extending between the bonding pads and the substrate edge and comprising a plurality of breaks, wherein each of the conductive traces comprises two extension sections and two end portions, the end portions respectively connected to the extension sections define the breaks, each of the end portions has a first width in a first direction, each of the extension sections has a second width in the first direction, and the first width is less than the second width.

2. The display panel according to claim 1, wherein the bonding pads are arranged on the substrate in a first direction, and the breaks of the conductive traces are staggered from each other in the first direction.

3. The display panel according to claim 1, further comprising a flexible printed circuit board disposed on one side of the substrate edge of the substrate and electrically bonded to the bonding pads.

4. The display panel according to claim 1, wherein the two extension sections are structurally separated from each other, each of the conductive traces further comprises a connection portion electrically connected between the extension sections, and the breaks are provided on the connection portions of the conductive traces.

5. The display panel according to claim 4, wherein resistivities of the extension sections of the conductive traces are less than resistivities of the connection portions of the conductive traces.

6. The display panel according to claim 1, wherein a shortest distance between the substrate edge of the substrate and the breaks is greater than or equal to 50 microns.

7. The display device according to claim 1, wherein a ratio of the first width to the second width is less than 0.5.

8. The display panel according to claim 1, wherein the substrate is a flexible substrate.

\* \* \* \* \*